US012593396B2

(12) United States Patent
Sapozhnikov et al.

(10) Patent No.: US 12,593,396 B2
(45) Date of Patent: Mar. 31, 2026

(54) VIA ASSEMBLY FOR PRINTED CIRCUIT BOARD

(71) Applicant: Cisco Technology, Inc., San Jose, CA (US)

(72) Inventors: Mike Sapozhnikov, San Jose, CA (US); Amendra Koul, San Francisco, CA (US); David Nozadze, San Jose, CA (US); Joel Richard Goergen, Soulsbyville, CA (US); Upen Reddy Kareti, Union City, CA (US); Sayed Ashraf Mamun, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 204 days.

(21) Appl. No.: 18/451,477

(22) Filed: Aug. 17, 2023

(65) Prior Publication Data

US 2025/0031300 A1     Jan. 23, 2025

Related U.S. Application Data

(60) Provisional application No. 63/514,624, filed on Jul. 20, 2023.

(51) Int. Cl.
*H05K 1/02* (2006.01)

(52) U.S. Cl.
CPC ......... *H05K 1/0251* (2013.01); *H05K 1/0222* (2013.01); *H05K 2201/0939* (2013.01); *H05K 2201/09481* (2013.01); *H05K 2201/09609* (2013.01)

(58) Field of Classification Search
None
See application file for complete search history.

(56) References Cited

U.S. PATENT DOCUMENTS

| | | | |
|---|---|---|---|
| 7,897,880 | B1 | 3/2011 | Goergen et al. |
| 8,476,537 | B2 | 7/2013 | Kushta |
| 10,231,325 | B1 | 3/2019 | Chengson et al. |
| 10,595,394 | B1 | 3/2020 | Kim et al. |

(Continued)

FOREIGN PATENT DOCUMENTS

| | | |
|---|---|---|
| CN | 112738999 A | 4/2021 |
| WO | 2020112481 A1 | 6/2020 |

OTHER PUBLICATIONS

Vardapetyan A., et al., "Via Design Optimization for High Speed Differential Interconnects on Circuit Boards", IEEE, Oct. 2020, 3 pages.

(Continued)

*Primary Examiner* — Timothy J Thompson
*Assistant Examiner* — John B Freal
(74) *Attorney, Agent, or Firm* — Edell, Shapiro & Finnan, LLC

(57) ABSTRACT

Provide for herein is an apparatus that includes multiple printed circuit board (PCB) layers and a via assembly. The via assembly includes a signal via extending through the multiple layers, and the signal via is configured to transmit a signal between the layers. The via assembly also includes a capacitive structure connected to the signal via to adjust an impedance of the via assembly along the via assembly. The capacitive structure is physically and electrically separate from other components of the PCB.

13 Claims, 6 Drawing Sheets

(56)                    References Cited

U.S. PATENT DOCUMENTS

| | | | |
|---|---|---|---|
| 11,324,119 B1 | 5/2022 | Dsilva et al. | |
| 2002/0130737 A1* | 9/2002 | Hreish ................. | H03H 7/0115 |
| | | | 333/204 |
| 2008/0093112 A1 | 4/2008 | Kushta | |
| 2010/0124035 A1 | 5/2010 | Bandholz et al. | |
| 2012/0215515 A1 | 8/2012 | Norte | |
| 2013/0033353 A1 | 2/2013 | Schaffer et al. | |
| 2021/0376448 A1 | 12/2021 | Drew et al. | |
| 2023/0066242 A1 | 3/2023 | Huh et al. | |
| 2023/0078323 A1 | 3/2023 | Pham et al. | |
| 2023/0290723 A1* | 9/2023 | Chen ....................... | H01L 25/16 |
| 2024/0008180 A1 | 1/2024 | Ben Artsi et al. | |

OTHER PUBLICATIONS

Gold Phoenix: "Types of PCB Pads", Gold Phoenix Printed Circuit Board XP093214183, Retrieved from https://www.goldphoenixpcb.com/html/Support_Resource/arc_10353.html, Section 1.5, p. 3-p. 4, Sep. 8, 2022, 7 Pages.

International Search Report and Written Opinion for International Application No. PCT/US2024/037700, mailed Oct. 24, 2024, 17 Pages.

Peterson Z., "Everything You Need to Know About Stitching Vias", PCB Layout, XP093214652, https://resources.altium.com/p/everything-you-need-know-about-stitching-vias, Jan. 16, 2023, 12 Pages.

* cited by examiner

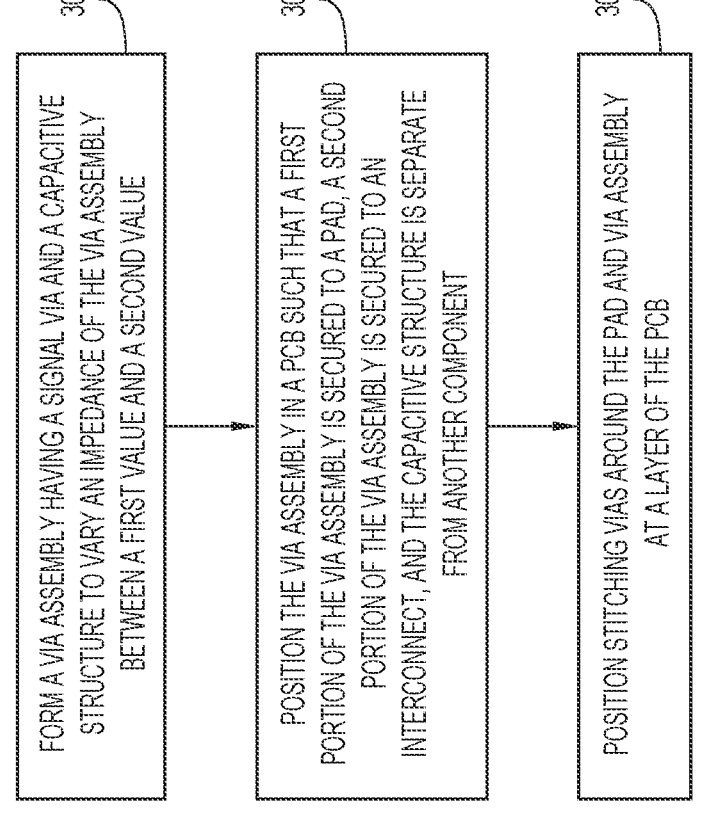

FORM A VIA ASSEMBLY HAVING A SIGNAL VIA AND A CAPACITIVE STRUCTURE TO VARY AN IMPEDANCE OF THE VIA ASSEMBLY BETWEEN A FIRST VALUE AND A SECOND VALUE ⟋ 302

POSITION THE VIA ASSEMBLY IN A PCB SUCH THAT A FIRST PORTION OF THE VIA ASSEMBLY IS SECURED TO A PAD, A SECOND PORTION OF THE VIA ASSEMBLY IS SECURED TO AN INTERCONNECT, AND THE CAPACITIVE STRUCTURE IS SEPARATE FROM ANOTHER COMPONENT ⟋ 304

POSITION STITCHING VIAS AROUND THE PAD AND VIA ASSEMBLY AT A LAYER OF THE PCB ⟋ 306

VIA ASSEMBLY FOR PRINTED CIRCUIT BOARD

CROSS-REFERENCE TO RELATED APPLICATION

This application claims priority to and the benefit of U.S. Provisional Patent Application No. 63/514,624, entitled "VIA ASSEMBLY FOR PRINTED CIRCUIT BOARD," filed Jul. 20, 2023, which is hereby incorporated by reference in its entirety for all purposes.

TECHNICAL FIELD

The present disclosure relates to printed circuit boards (PCBs).

BACKGROUND

A printed circuit board (PCB) electrically couples various electronic components with one another. For example, a PCB may include multiple layers, each having different electronic components and traces routed along the layers to electrically couple electronic components of the same layer. Additionally, the PCB may include vias that extend between layers to electrically couple electronic components of different layers to one another. For example, a signal may propagate from a first electronic component of a first layer, through a first trace routed along the first layer, through a via extending from the first layer to a second layer, through a second trace routed along the second layer, and to an electronic component of the second layer. Unfortunately, electrical property discontinuities along the path of travel of the via, such as differences between electronic properties of any of the components (e.g., an electronic component, a trace, a via), may affect transmission of the signal. For example, a sudden change in impedance may result in excessive or poor signal loss, thereby limiting or reducing effective operation of the PCB.

BRIEF DESCRIPTION OF THE DRAWINGS

FIG. 6 is a flowchart of a method of manufacturing a PCB, according to an example embodiment.

DETAILED DESCRIPTION

Overview

Techniques are provided herein for reducing impedance discontinuities for a printed circuit board (PCB). In some aspects, the techniques described herein relate to an apparatus, including: a layer of a printed circuit board (PCB); a signal via extending through the layer, wherein the signal via is configured to transmit a signal therethrough; and a capacitive structure connected to the signal via at the layer, wherein the capacitive structure is electrically separate from each other component of the PCB at the layer.

According to other aspects, the techniques described herein relate to a method including: extending a signal via through a layer of a printed circuit board (PCB); and connecting a capacitive structure to the signal via at the layer of the PCB to form a via assembly, wherein the capacitive structure is electrically separate from each other component of the PCB at the layer, and the capacitive structure varies an impedance of the via assembly between a first value and a second value.

In still other aspects, the techniques described herein relate to an apparatus including: a plurality of layers of a printed circuit board (PCB); and a via assembly including: a signal via extending from a first layer of the plurality of layers to a second layer of the plurality of layers; and a capacitive structure connected to the signal via between the first layer and the second layer, wherein the capacitive structure is physically separate from each other component of the PCB.

Example Embodiments

Figure 1:
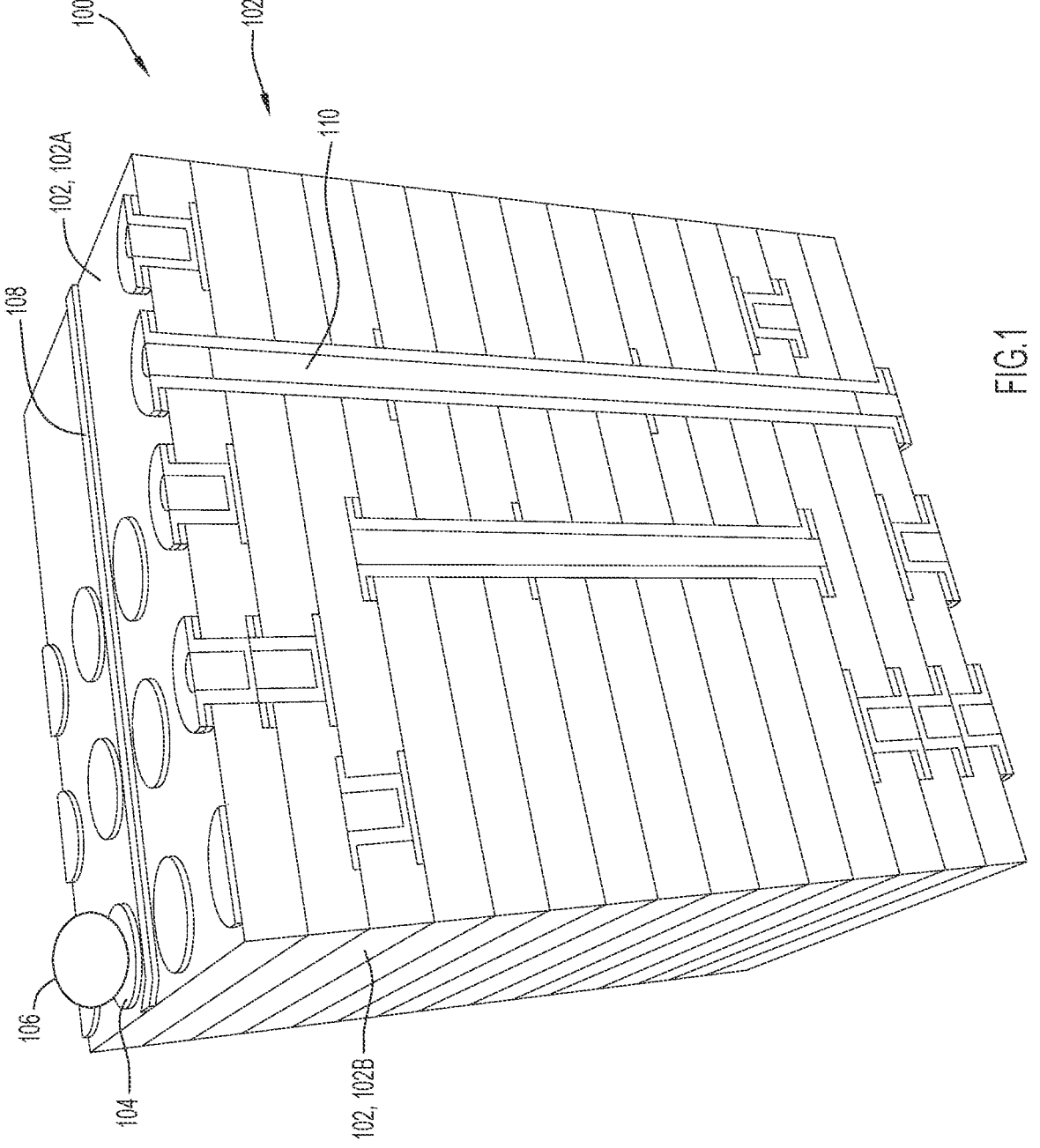
FIG. 1 is a perspective cross-sectional view of a printed circuit board (PCB) that includes multiple layers, according to an example embodiment.

With reference made to FIG. 1, depicted therein is a cross-sectional view of a PCB 100 having multiple layers 102. Each layer 102 may include different electronic components that are electrically coupled to one another. By way of example, a first layer 102A (e.g., a top layer) may include multiple pads 104 that are exposed to an exterior environment of the PCB 100. The pads 104 enable electrically coupling of the PCB 100 to a separate component, such as an integrated circuit (IC). For example, an interconnect 106, such as a solder ball, may be used to electrically couple one of the pads 104 to the separate component. A trace 108 may also be electrically coupled to the pad 104 and routed along the first layer 102A to electrically couple the pad 104, and therefore the interconnect 106 and the separate component electrically coupled to the pad 104, to an electronic component (e.g., an IC, such as an application-specific IC (ASIC), a resistor, a transistor, a capacitor, a switch, an inductor, a transformer, a sensor, a diode, a relay) of the first layer 102A.

Moreover, the PCB 100 includes vias 110 (e.g., signal vias) that extends through multiple layers 102 of the PCB 100 to electrically couple electronic components of different layers 102 to one another. For instance, one of the vias 110 may be electrically coupled to the pad 104 that is electrically coupled to the interconnect 106, and the via 110 may extend from the first layer 102A to a second layer 102B (e.g., an inner layer, a mid layer) of the PCB 100. A trace routed along the second layer 102B may be electrically coupled to the via 110 and to an electronic component of the second layer 102B. As such, the via 110 may help electrically couple the electronic component of the second layer 102B to the electronic component of the first layer 102A and/or to the separate component electrically coupled to the pad 104.

By way of example, during operation of the PCB 100, a signal may be transmitted between the electronic component of the first layer 102A, the electronic component of the second layer 102B, and/or the separate component electrically coupled to the PCB 100. For instance, the separate component may transmit the signal to the pad 104 by way of the interconnect 106, and the signal may propagate through the trace 108 secured/connected to the pad 104 and routed along the first layer 102A toward the electronic component of the first layer 102A and/or through the via 110 toward the second layer 102B, through the trace routed along the second layer 102B and electrically coupled to the via 110, and toward the electronic component of the second layer 102B. However, discontinuities in a certain electrical property along the path of travel of the signal, such as between the components along which the signal travels, may affect signal transmission. For example, a sudden change in the impedance of the components may cause excessive signal loss, thereby reducing signal integrity. Consequently, operation of the PCB 100 effectuated by signal propagation may be reduced or limited.

For this reason, the components of the PCB 100 may be manufactured or otherwise configured to limit impedance discontinuities, such as by reducing sudden changes in impedance. In other words, the impedance may gradually vary between the components of the PCB 100. As an example, an impedance along the via 110 may be gradually tuned from the impedance of the interconnect 106 to the impedance of the trace secured/connected to the via 110, rather than tuning the impedance along the via 110 to be consistent (e.g., maintained at the impedance of the trace), for instance. As such, potential signal loss may be improved (e.g., reduced) to increase signal integrity and improve operation of the PCB 100.

Figure 2:
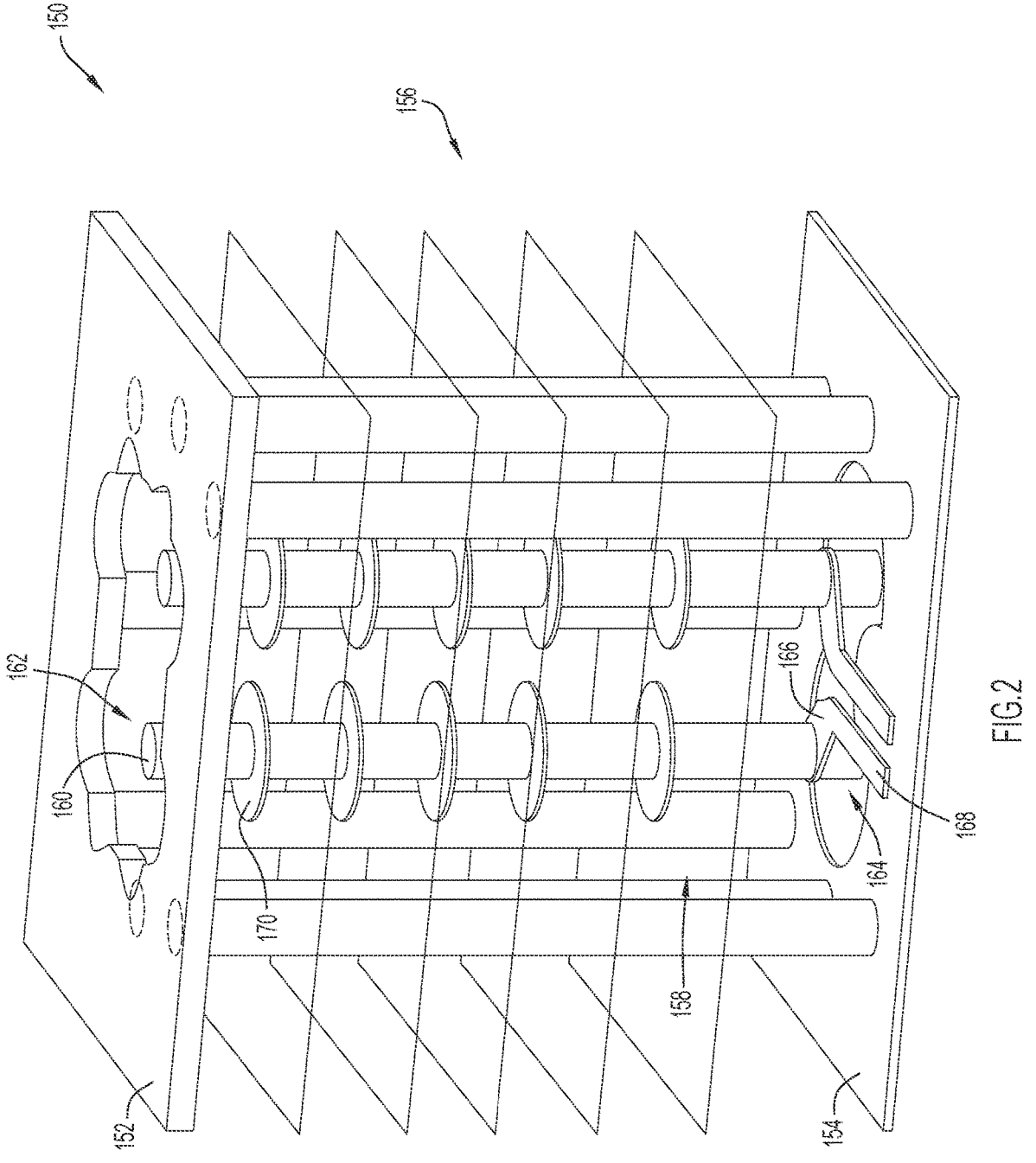
FIG. 2 is a schematic diagram of a PCB that includes multiple layers, according to an example embodiment.

FIG. 2 is a schematic diagram of a PCB 150. The PCB 150 includes a first layer 152 (e.g., a top layer), a second layer 154 (e.g., an inner layer, a mid layer, a bottom layer), and a plurality of intermediate layers 156 (e.g., inner layers, mid layers) between the first layer 152 and the second layer 154. Via assemblies 158 extend between the first layer 152 and the second layer 154 to electrically couple components of the first layer 152 and of the second layer 154 to one another. By way of example, the via assembly 158 includes a signal via 160 having a first portion 162 that extends to the first layer 152 and is secured/connected to an interconnect or to a pad coupled to an interconnect, as well as a second portion 164 that extends to the second layer 154 and is secured/connected to a pad 166 coupled to a trace 168 routed along the second layer 154.

In some embodiments, the interconnect and/or pad connected to the first portion 162 of the signal via 160 has a first impedance (e.g., a relatively lower impedance), and the pad 166 connected to the second portion 164 has a second impedance (e.g., a relatively greater impedance) that is substantially different from the first impedance. The signal via 160 may also inherently have a third impedance that is different from the first impedance and/or from the second impedance. For instance, the signal via 160 may be relatively inductive and therefore have a higher impedance, especially for transmission of signals associated with greater fundamental frequencies (e.g., for higher data rate transmissions). However, the via assembly 158 may be manufactured to have an impedance that gradually changes between the first impedance and the second impedance, thereby reducing a sudden change in impedance between the interconnect and/or the pad connected to the first portion 162 of the signal via 160 and the pad 166 connected to the second portion 164. In other words, the via assembly 158 reconciles differences in impedances between the interconnect/pad connected to the first portion 162, the signal via 160, and the pad 166 connected to the second portion 164. For example, the impedance along the via assembly 158 may be cased and tuned from the first impedance close to the interconnect to the second impedance close to the pad 166.

To this end, the via assembly 158 includes a plurality of capacitive structures 170 connected to the signal via 160, such as by surrounding and capturing a portion of the signal via 160. The capacitive structures 170 adjust a capacitance of a portion of the via assembly 158, thereby correspondingly compensating for the inductance of the signal via 160 and adjusting the impedance of the portion of the via assembly 158 (e.g., to reconcile the first impedance of the interconnect and/or of the pad, the second impedance of the pad 166, and the third impedance of the signal via 160). For example, each capacitive structure 170 may be composed of a metallic or other conductive material. Thus, an electrical charge may be stored between adjacent capacitive structures 170, between a ground (e.g., a ground layer, such as one of the intermediate layers 156, providing a return path for current flow) and any of the capacitive structures 170, and/or at any other suitable location to increase capacitance and decrease impedance along the via assembly 158.

As an example, the capacitive structures 170 may cause the impedance of the via assembly 158 near the first portion 162 of the signal via 160 to be substantially similar to (e.g., within a threshold value of) the first impedance and may cause the impedance of the via assembly 158 near the second portion 164 of the signal via 160 to be substantially similar to (e.g., within a threshold value of) the second impedance. The capacitive structure 170 may also cause (e.g., gradually tune) the impedance of the via assembly 158 near an intermediate portion of the signal via 160 between the first portion 162 and the second portion 164 of the signal via 160 to vary between the first impedance and the second impedance. Thus, from the first portion 162 toward the second portion 164 of the signal via 160, the capacitive structure 170 may adjust the impedance of the via assembly 158 from the first impedance toward the second impedance.

In some embodiments, each capacitive structure 170 may be positioned at a respective layer of the PCB 150, such as at one of the intermediate layers 156, which may include a signal layer (e.g., along which a signal may be transmitted between electronic components), a ground layer, and/or a power layer (e.g., from which a signal may originate). However, the capacitive structure 170 may not be connected or electrically coupled to any other component (e.g., a trace) at those layers. In this manner, the capacitive structures 170 are dedicated to adjusting the impedance of the via assembly 158, rather than for electrically coupling the via assembly 158 to additional components. As such, the capacitive structures 170 may be considered non-functional (e.g., non-functional pads that are not used for electrically coupling purposes, in contrast with the pad 166 that functions to electrically couple the via assembly 158 to the trace 168). In additional or alternative embodiments, the capacitive structures 170 may be positioned between layers, such as between adjacent intermediate layers 156, and therefore may not be positioned at any particular layer of the PCB 150. In any of these cases, the capacitive structure 170 may be physically separate from other components of the PCB 150 to adjust impedance of the via assembly 158.

The illustrated capacitive structures 170 include a plate or pad configuration with a circular shape, such as a geometric profile that substantially matches that of a pad used to electrically couple a signal via to a trace or interconnect. However, the capacitive structures 170 may additionally or alternatively include any other suitable configuration, such as a block shape, a prismatic shape, a spherical shape, a cylindrical shape, a non-circular curved (e.g., oval) shape, and/or an irregular shape. In certain embodiments, the shape of the capacitive structures 170 may be based on its positioning to adjust the impedance of the via assembly 158 more desirably. For example, a capacitive structure 170 positioned on a signal layer may have a more oval shape to accommodate its distance from a ground layer, other conductive components positioned on the signal layer, or any other aspect that may affect the capacitance and impedance of the via assembly 158 at the signal layer. Moreover, the via assembly 158 may include any suitable quantity of capacitive structures 170 connected to the signal via 160, as well as any suitable distribution or positioning of the capacitive structures 170 at the via assembly 158 (e.g., the capacitive structures 170 may be placed equidistant or at different distances from one another along the via assembly 158). In addition, each capacitive structure 170 may include a single integral component and/or multiple separate components that are connected or attached to one another. The capacitive structures 170 may be arranged based on the impedances at the first portion 162 and at the second portion 164 to gradually vary the impedance of the via assembly 158 more suitably.

Figure 3:
FIG. 3 is a top view of a layer of a PCB, according to an example embodiment.
Figure 3:
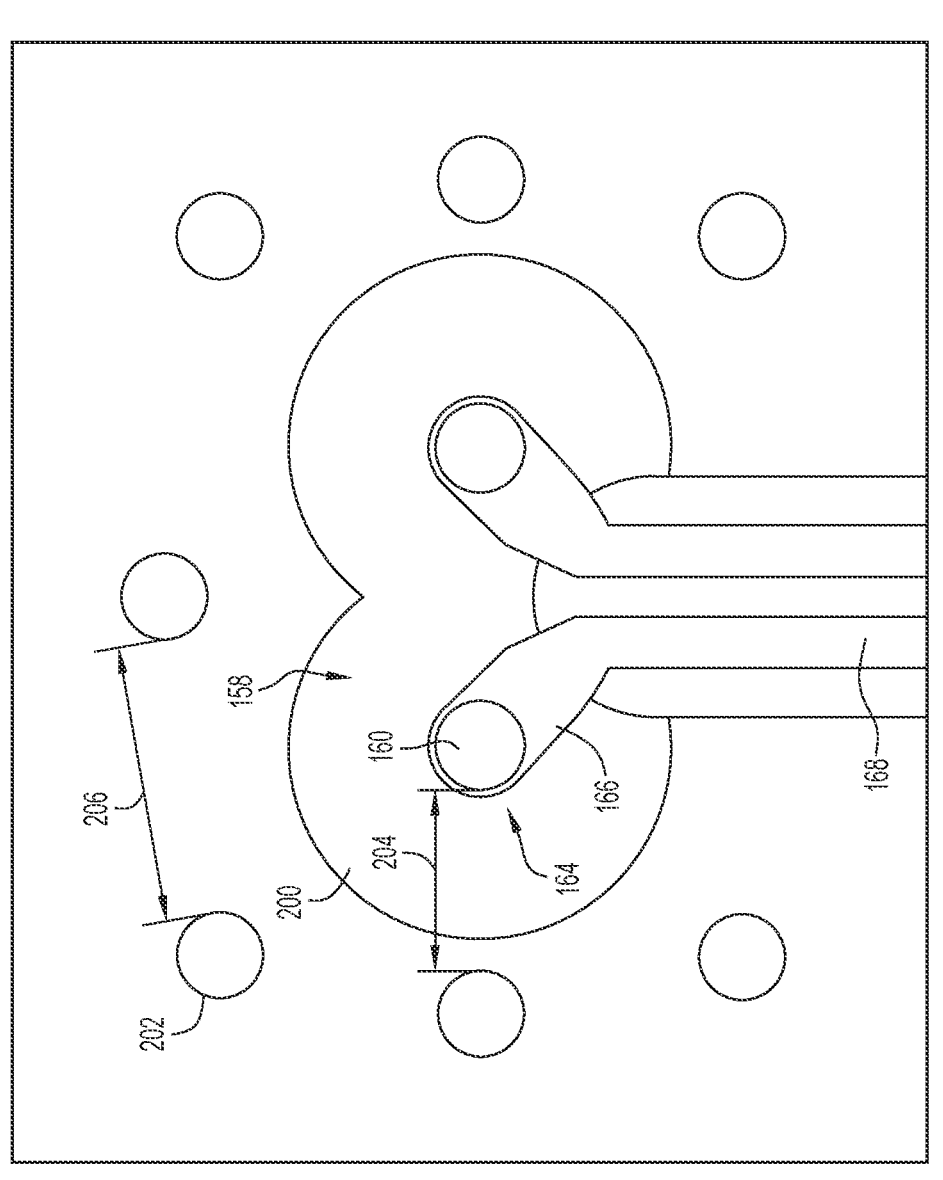

In addition to the capacitive structures 170, other components of the PCB 150 may help tune the impedance along a path of travel of a signal to improve signal transmission. To provide another example, FIG. 3 is a top view of an embodiment of the second layer 154 of the PCB 150 illustrating the signal via 160 (e.g., the second portion 164 of the signal via 160) of the via assembly 158, the pad 166 connected to the signal via 160, and the trace 168 coupled to the pad 166. In the illustrated embodiment, the second layer 154 includes an antipad or a space 200 surrounding the signal via 160 and the pad 166 to avoid undesirable or unintentional signal propagation to the signal via 160 (e.g., transmitted through an adjacent trace that is not electrically coupled to the signal via 160). However, in additional or alternative embodiments, the second layer 154 may not include the antipad 200, and the second layer 154 may extend into contact with the signal via 160 and/or with the pad 166.

The pad 166 may include an oval shape to provide an impedance that may better match that of the second portion 164 of the signal via 160 and/or of the trace 168. For example, as compared to a pad having a circular shape, the pad 166 having the oval shape may have a lower capacitance and correspondingly higher impedance, which may be more similar to the impedance of the via assembly 158 near the second portion 164 of the signal via 160 and/or to the impedance of the trace 168 coupled to the pad 166. That is, the pad 166 having the oval shape and the via assembly 158 having the capacitive structures 170 may cooperatively cause the respective impedances to match more closely to one another. As such, the pad 166 having the oval shape may exhibit reduced impedance discontinuities between the via assembly 158 and the pad 166 and/or between the pad 166 and the trace 168 to improve signal transmission between the signal via 160 and the trace 168, such as for signals associated with higher fundamental frequencies. Moreover, the pad 166 having the oval shape may occupy a smaller overall physical footprint (e.g., surface area). For this reason, a size of the antipad 200 surrounding the signal via 160 and the pad 166 may be reduced and still maintain a desirable distance away from the pad 166 to avoid negatively affecting signal propagation. Reducing the size of the antipad 200 may facilitate case of manufacture of the second layer 154.

Stitching or ground vias 202 may also be positioned at the second layer 154 to collectively surround the signal via 160 and the pad 166 (e.g., by surrounding the antipad 200). The stitching vias 202 may electrically couple the second layer 154 to a ground (e.g., a ground layer). Additionally, the stitching vias 202 may help signal propagation. For example, the positioning of the stitching vias 202 around the signal via 160 and the pad 166 may reduce electric field leakage associated with the signal via 160 and with the pad 166 to isolate the electric fields, thereby reducing signal loss and facilitating signal transmission along the signal via 160 and the pad 166. That is, the stitching vias 202 may help block a signal from being undesirably emitted off the signal via 160 and/or off the pad 166, thereby forcing the signal to propagate along the signal via 160 and/or along the pad 166. In this manner, the stitching vias 202 may further improve signal integrity.

In certain embodiments, each stitching via 202 may be positioned within a first threshold distance 204 of the signal via 160 and/or within a second threshold distance 206 of one another to isolate electric fields effectively. The first threshold distance 204 and the second threshold distance 206 may be based on signal wavelength, which may be further based on a data rate or fundamental frequency of signal transmission. For example, for a data rate transmission of 56 gigabytes per second (Gbps) or a fundamental frequency of 14 gigahertz (GHz), the first threshold distance 204 may be 2-3 millimeters (mm), such as 2.4 mm, 2.5 mm, or 2.6 mm, and the second threshold distance 206 may be 1-2 mm, such as 1.2 mm, 1.3 mm, or 1.4 mm. For a data rate transmission of 112 Gbps or a fundamental frequency of 28 GHz, the first threshold distance 204 may be 1-2 mm (e.g., 1.2 mm, 1.3 mm, 1.4 mm) and the second threshold distance 206 may be 0.5-1 mm (e.g., 0.6 mm, 0.7 mm, 0.8 mm). For a data rate transmission of 224 Gbps or a fundamental frequency of 56 GHZ, the first threshold distance 204 may be 0.5-1 mm (e.g., 0.6 mm, 0.7 mm, 0.8 mm) and the second threshold distance 206 may be 0.1-0.5 mm (e.g., 0.2 mm, 0.3 mm, 0.4 mm). By way of example, the first threshold distance 204 may be less than $\frac{1}{2}$ of the signal wavelength (e.g., around $\frac{1}{4}$ of the signal wavelength), and the second threshold distance 206 may be around $\frac{1}{8}$ of the signal wavelength. Thus, the second threshold distance 206 may be less than the first threshold distance 204. However, the stitching vias 202 may also be distributed in any other suitable manner around the signal via 160 and the pad 166, such as at the same distance or at different distances from one another and/or at the same distance or at different distances from the signal via 160. Furthermore, although the illustrated second layer 154 includes 7 stitching vias 202 positioned around the signal via 160 and the pad 166, any suitable quantity, such as more than 7, of the stitching vias 202 may be positioned around the signal via 160 and the pad 166 in additional or alternative embodiments.

Figure 4:
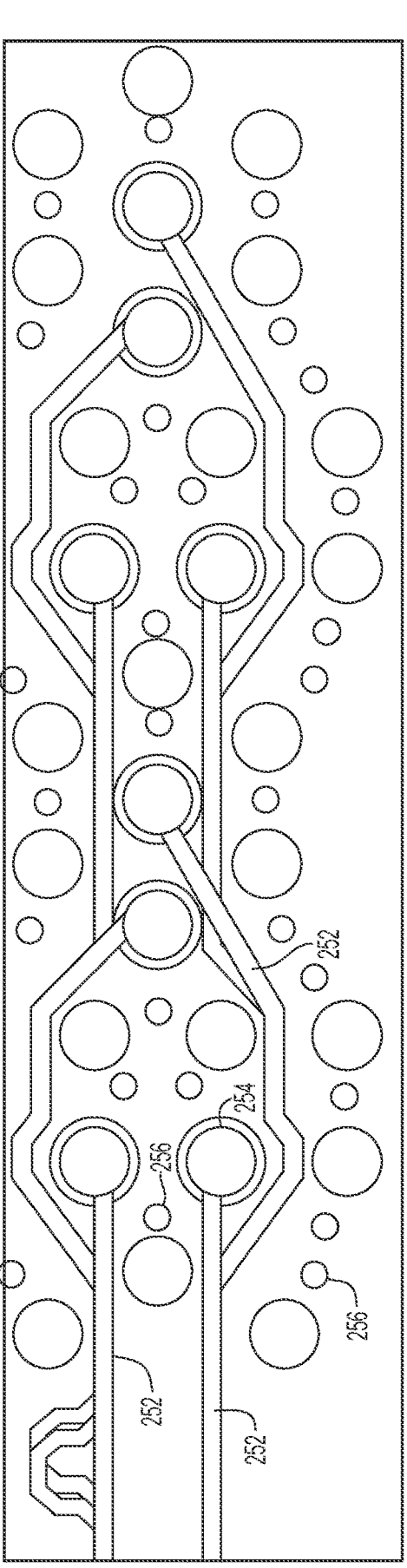
FIG. 4 is a schematic diagram of a PCB, according to an example embodiment.

As another example of improving signal transmission, FIG. 4 is a schematic diagram of a PCB 250 illustrating various traces 252 routed along different layers of the PCB 250 and pads 254 coupled to the traces 252. For example, a pad 254 may electrically couple a trace 252 to a signal via extending through multiple layers of the PCB 250 to enable a signal to propagate through multiple layers by way of the trace 252, the pad 254, and the signal via. The PCB 250 also includes stitching vias 256 that may extend through multiple layers of the PCB 250. The stitching vias 256 may be arranged to improve signal propagation, such as to reduce signal loss and/or to limit crosstalk.

For example, some of the stitching vias 256 may collectively be positioned around a signal via (e.g., within the first threshold distance 204 of the signal via, within the second threshold distance 206 of one another) to reduce electric field leakage associated with the signal via, thereby isolating the electric fields of the signal via. Additionally, some of the stitching vias 256 may be collectively positioned around a trace 252 and reduce electric field leakage associated with the trace 252 and help isolate the electric fields of the trace 252. In this manner, the stitching vias 256 may also be arranged based on routing (e.g., direction of extension) of the traces 252, such as alongside or adjacent to different portions of a trace 252, to improve signal propagation. The arrangement of the stitching vias 202 may also be based on other aspects, such as an available manufacturing operation, to provide suitable signal propagation benefits.

Figure 5:
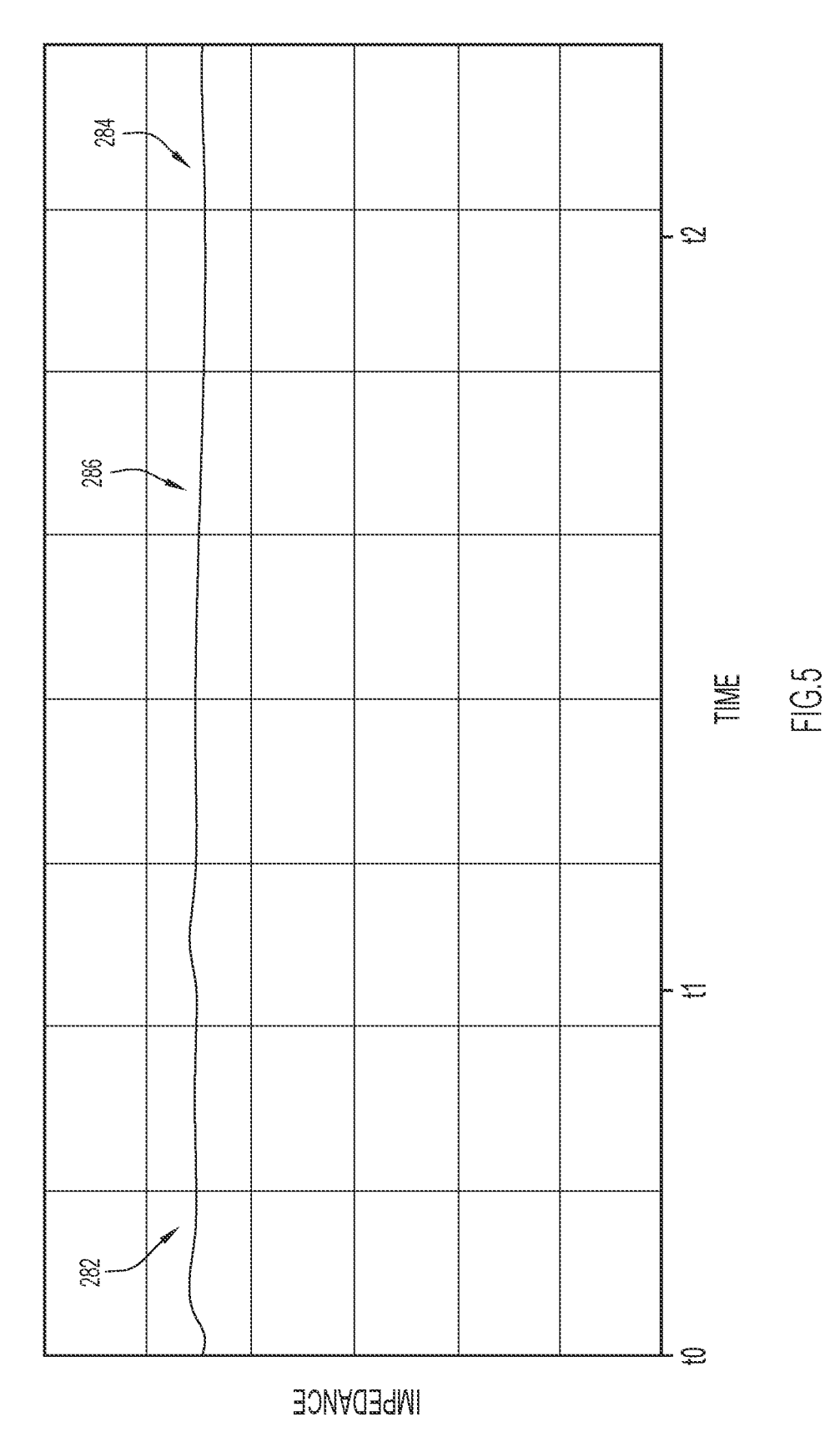
FIG. 5 is a graph illustrating impedance of components associated with different times of travel for a signal, according to an example embodiment.

FIG. 5 is a graph 280 illustrating the impedance of components along a path of travel of a signal. For example, the impedances may be determined by way of a time domain reflectometry technique in which reflections of a signal indicative of impedance are determined. Graph 280 shows the impedance over a period of time to indicate the imped- ance of different components. Thus, different times indicated by the graph 280 may be associated with the signal traveling along a different component. For example, the signal may travel along a trace between times t0 and t1, along a via assembly (e.g., a signal via) between times t1 and t2, and along an interconnect after time t2. The time between t0 and t1 may be associated with a first impedance level 282, and the time after t2 may be associated with a second impedance level 284, less than the first impedance level 282.

In certain embodiments, each of the first impedance level 282 and the second impedance level 284 may be relatively constant. That is, the first impedance level 282 and the second impedance level 284 may not significantly change over time (e.g., the respective impedances along a trace and along an interconnect do not change substantially). Addi- tionally, it may be difficult to adjust the first impedance level 282 between t0 and t1 and/or the second impedance level 284 after t2 (e.g., toward one another). For example, altera- tions to the impedances of traces and/or interconnects may be limited due to manufacturability and implementation. However, the impedance of the via assembly may be more readily adjusted. For instance, the via assembly may be manufactured, such as by including capacitive structures, such that the impedance of the via assembly decreases from the first impedance level 282 to the second impedance level 284. That is, the impedance along the via assembly changes such that a third impedance level 286 from time t1 to time t2 gradually decreases from the first impedance level 282 to the second impedance level 284. As a result, a sudden change in impedance, which may otherwise occur in imple- mentations in which the impedance of the via assembly is constant (e.g., near the first impedance level 282, near the second impedance level 284, near an intermediate imped- ance level) rather than gradually changing (e.g., decreasing), may be avoided throughout the period of time of signal travel. As such, the impedance over the period of time of signal travel gradually changes to avoid potential impedance discontinuities. Consequently, integrity of the signal may be improved.

FIG. 6 is a flowchart of a method 300 of manufacturing a PCB, such as any of the PCBs 100, 150, 250 discussed herein. In certain embodiments, the method 300 may be performed automatically, such as by a processor executing instructions stored on a memory. In additional or alternative embodiments, the method 300 may be performed manually, such as by an operator. It should be noted that the method 300 may be performed differently than depicted. For example, additional operations may be performed, any of the depicted operations may not be performed, and/or the depicted operations may be performed in a different order. At step 302, a via assembly is formed. The via assembly includes a signal via and a capacitive structure connected to the signal via. For example, the signal via encloses and capture an outer perimeter (e.g., a circumference) of the signal via. The capacitive structure is arranged to vary an impedance of the via assembly between a first value and a second value. In particular, a first portion (e.g., a first end) of the via assembly has an impedance of the first value, and a second portion (e.g., a second end) of the via assembly has an impedance of the second value, and the impedance of the via assembly gradually varies or adjusts from the first value to the second value between the first portion and the second portion.

At step 304, the via assembly is positioned in the PCB such that the first portion of the via assembly (e.g., of a signal via of the via assembly) is secured/connected to a pad at a first layer and a second portion of the via assembly (e.g., of the signal via of the via assembly) is secured/connected to an interconnect at a second layer. Thus, the via assembly electrically couples the pad and the interconnect to one another. By way of example, the pad includes an impedance that is substantially similar to (e.g., within a threshold of) the first value at the first portion of the via assembly, and the interconnect includes an impedance that is substantially similar to (e.g., within a threshold of) the second value at the second portion of the via assembly. In this manner, the impedance from the pad to the interconnect gradually changes from the first value to the second value by way of the via assembly. As such, a sudden change in impedance is avoided to reduce signal loss associated with a signal propagating between the pad and the interconnect. The change in impedance, e.g., a gradual change in impedance, improves signal integrity and overall operation of the PCB.

Additionally, such positioning of the via assembly physi- cally and electrically separates the capacitive structure from other components. For example, the capacitive structure may be positioned at a third layer that is between the first layer and the second layer of the PCB. The third layer may include other components, such as a pad, another signal via, an electronic component, and/or a trace. However, the capacitive structure may not be in contact with, connected to, or otherwise electrically coupled to any of the other components. Instead, the capacitive structure is dedicated to changing the impedance of the via assembly. For example, the capacitive structure increases capacitance of the via assembly by enabling an electrical charge to be stored between the capacitive structure and an adjacent capacitance structure and/or between the capacitive structure and ground. The increase in capacitance may correspondingly reduce the impedance of the via assembly.

At step 306, stitching vias are positioned around the pad and the via assembly at the first layer of the PCB at which the pad is arranged. By way of example, the stitching vias collectively surround the pad and the first portion of the via assembly at the second layer to isolate an electric field originating from the pad and the via assembly at the second layer. In this way, the stitching vias facilitate signal trans- mission through the pad and the via assembly. In certain embodiments, the stitching vias are positioned within a first threshold distance from the first portion of the via assembly and within a second threshold distance from one another. The first threshold distance and/or the second threshold distance may be based on an operation of the PCB (e.g., a data rate in which signal is transmitted), a routing of a trace coupled to the pad, and/or a manufacturability. As an example, the first threshold distance may be less than ½ of the signal wavelength (e.g., around ¼ of the signal wavelength), and the second threshold distance may be less than the first threshold distance (e.g., around ⅛ of the signal wavelength).

The embodiments discussed herein provide techniques for improving or reducing signal loss of a PCB, such as for signals associated with relatively higher fundamental frequencies. Such techniques include providing a via assembly having a signal via that extends through multiple layers of the PCB, as well as one or more capacitive structures (e.g., non-functional components that do not electrically couple the via assembly to another component) coupled to the signal via. The one or more capacitive structures may be positioned at a respective layer of the PCB, such as at a ground layer, a signal layer, and/or a power layer, and may have a circular shape and/or an oval shape (e.g., for positioning at a signal layer). The capacitive structures help tune the impedance of the via assembly, such as between an impedance of an interconnect and an impedance of a pad close to opposite ends of the signal via, thereby reducing impedance discontinuities. For example, the capacitive structures may gradually tune the impedance from a first value to a second value to reduce impedance discontinuities. Additionally, stitching vias may be positioned within a threshold distance of the signal via, such as at less than half (e.g., about a quarter) of a wavelength associated with signals to be transmitted through the signal via. Such positioning of the stitching vias may reduce electric field leakage of the signal via, further reducing signal loss. Consequently, signal integrity is improved, and effective operation of the PCB may be achieved.

In some aspects, the techniques described herein relate to an apparatus, including: a layer of a printed circuit board (PCB); a signal via extending through the layer, wherein the signal via is configured to transmit a signal therethrough; and a capacitive structure connected to the signal via at the layer, wherein the capacitive structure is electrically separate from each other component of the PCB at the layer.

In some aspects, the techniques described herein relate to an apparatus, including: an additional layer of the PCB; a trace routed along the additional layer; and a pad connected to the signal via at the additional layer, wherein the pad is connected to the trace to electrically couple the signal via and the pad to one another.

In some aspects, the techniques described herein relate to an apparatus, wherein the pad includes an oval shape.

In some aspects, the techniques described herein relate to an apparatus, including a plurality of ground vias positioned at the additional layer and within a threshold distance of the signal via.

In some aspects, the techniques described herein relate to an apparatus, wherein the plurality of ground vias collectively surround the pad.

In some aspects, the techniques described herein relate to an apparatus, wherein a quantity of the plurality of ground vias is greater than a threshold quantity.

In some aspects, the techniques described herein relate to an apparatus, wherein the pad is connected to a first portion of the signal via, and the PCB includes an interconnect connected to a second portion of the signal via.

In some aspects, the techniques described herein relate to a method including: extending a signal via through a layer of a printed circuit board (PCB); and connecting a capacitive structure to the signal via at the layer of the PCB to form a via assembly, wherein the capacitive structure is electrically separate from each other component of the PCB at the layer, and the capacitive structure varies an impedance of the via assembly between a first value and a second value.

In some aspects, the techniques described herein relate to a method, including connecting a first portion of the via assembly to a first component of the PCB, wherein an impedance of the first portion of the via assembly is the first value and is within a first threshold of a third value of an impedance of the first component.

In some aspects, the techniques described herein relate to a method, including connecting a second portion of the via assembly to a second component of the PCB, wherein an impedance of the second portion of the via assembly is the second value and is within a second threshold of a fourth value of an impedance of the second component.

In some aspects, the techniques described herein relate to a method, wherein the first component includes a trace, and the second component includes an interconnect.

In some aspects, the techniques described herein relate to a method, including positioning a plurality of ground vias around the signal via at an additional layer of the PCB and within a threshold distance of the signal via.

In some aspects, the techniques described herein relate to a method, wherein positioning the plurality of ground vias around the signal via includes positioning the plurality of ground vias within an additional threshold distance from one another, and the additional threshold distance is less than the threshold distance.

In some aspects, the techniques described herein relate to a method, including connecting a pad to the signal via, wherein the pad is coupled to a trace configured to transmit a signal.

In some aspects, the techniques described herein relate to an apparatus including: a plurality of layers of a printed circuit board (PCB); and a via assembly including: a signal via extending from a first layer of the plurality of layers to a second layer of the plurality of layers; and a capacitive structure connected to the signal via between the first layer and the second layer, wherein the capacitive structure is physically separate from each other component of the PCB.

In some aspects, the techniques described herein relate to an apparatus, wherein the signal via is coupled to a first component of the first layer at a first portion of the via assembly, the signal via is coupled to a second component of the second layer at a second portion of the via assembly, and the capacitive structure is connected to the signal via such that a first impedance of the first portion of the via assembly is within a first threshold of a second impedance of the first component and a third impedance of the second portion of the via assembly is within a second threshold of a fourth impedance of the second component.

In some aspects, the techniques described herein relate to an apparatus, wherein the capacitive structure is connected to the signal via such that a fifth impedance of the via assembly between the first portion and the second portion varies between the first impedance of the first portion and the third impedance of the second portion.

In some aspects, the techniques described herein relate to an apparatus, including the first component and the second component, wherein the first component includes a trace, and the second component includes an interconnect.

In some aspects, the techniques described herein relate to an apparatus, wherein the capacitive structure is connected to the signal via by capturing a perimeter of the signal via.

In some aspects, the techniques described herein relate to an apparatus, wherein the capacitive structure includes a plate or pad configuration.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus, comprising:
   a layer of a printed circuit board (PCB);
   a signal via extending through the layer, wherein the signal via is configured to transmit a signal therethrough;
   a capacitive structure connected to the signal via at the layer, wherein the capacitive structure is electrically separate from each other component of the PCB at the layer;
   an additional layer of the PCB;
   a trace routed along the additional layer;
   a pad connected to the signal via at the additional layer, wherein the pad is connected to the trace to electrically couple the signal via and the pad to one another; and
   a plurality of ground vias positioned at the additional layer and within a threshold distance of the signal via, wherein a quantity of the plurality of ground vias is greater than a threshold quantity.

2. The apparatus of claim 1, wherein the pad comprises an oval shape.

3. The apparatus of claim 1, wherein the plurality of ground vias collectively surround the pad.

4. The apparatus of claim 1, wherein the pad is connected to a first portion of the signal via, and the PCB comprises an interconnect connected to a second portion of the signal via.

5. An apparatus comprising:
   a plurality of layers of a printed circuit board (PCB); and
   a via assembly comprising:
      a signal via extending from a first layer of the plurality of layers to a second layer of the plurality of layers; and
      a capacitive structure connected to the signal via between the first layer and the second layer, wherein the capacitive structure is physically separate from each other component of the PCB, and the capacitive structure is positioned along the signal via to limit a change in impedance of the via assembly from the first layer to the second layer within a threshold value.

6. The apparatus of claim 5, wherein the signal via is coupled to a first component of the first layer at a first portion of the via assembly, the signal via is coupled to a second component of the second layer at a second portion of the via assembly, and the capacitive structure is connected to the signal via such that a first impedance of the first portion of the via assembly is within a first threshold of a second impedance of the first component and a third impedance of the second portion of the via assembly is within a second threshold of a fourth impedance of the second component.

7. The apparatus of claim 6, wherein the capacitive structure is connected to the signal via such that a fifth impedance of the via assembly between the first portion and the second portion varies between the first impedance of the first portion and the third impedance of the second portion.

8. The apparatus of claim 6, comprising the first component and the second component, wherein the first component comprises a trace, and the second component comprises an interconnect.

9. The apparatus of claim 5, wherein the capacitive structure is connected to the signal via by capturing a perimeter of the signal via.

10. The apparatus of claim 5, wherein the capacitive structure includes a plate or pad configuration.

11. The apparatus of claim 5, wherein the signal via is coupled to a trace of the first layer, and the apparatus comprises a plurality of ground vias positioned at the first layer and within a threshold distance of the signal via.

12. The apparatus of claim 11, wherein a quantity of the plurality of ground vias is greater than a threshold quantity.

13. The apparatus of claim 11, wherein the signal via is coupled to the trace by way of a pad.

* * * * *